US011838016B2

(12) United States Patent
Escoffier et al.

(10) Patent No.: US 11,838,016 B2
(45) Date of Patent: Dec. 5, 2023

(54) TRANSISTOR ASSOCIATION

(71) Applicant: Commissariat à l'Énergie Atomique et aux Énergies Alternatives, Paris (FR)

(72) Inventors: René Escoffier, Grenoble (FR); Julien Buckley, Grenoble (FR)

(73) Assignee: Commissariat à l'Énergie Atomique et aux Énergies Alternatives, Paris (FR)

(*) Notice: Subject to any disclaimer, the term of this patent is extended or adjusted under 35 U.S.C. 154(b) by 0 days.

(21) Appl. No.: 17/639,857

(22) PCT Filed: Sep. 4, 2020

(86) PCT No.: PCT/EP2020/074832
§ 371 (c)(1),
(2) Date: Mar. 2, 2022

(87) PCT Pub. No.: WO2021/044017
PCT Pub. Date: Mar. 11, 2021

(65) Prior Publication Data
US 2022/0329242 A1    Oct. 13, 2022

(30) Foreign Application Priority Data

Sep. 5, 2019   (FR) .................................. 1909771

(51) Int. Cl.
*H03K 17/687* (2006.01)
*G01R 19/00* (2006.01)

(52) U.S. Cl.
CPC ..... *H03K 17/6871* (2013.01); *G01R 19/0092* (2013.01)

(58) Field of Classification Search
CPC .................................................. H03K 17/6871
See application file for complete search history.

(56) References Cited

U.S. PATENT DOCUMENTS 6,218,888 B1 *   4/2001   Otsuki ................ H01L 27/0248
327/482

FOREIGN PATENT DOCUMENTS

JP         3698323 B2 *   9/2005   ......... H03K 17/0822

OTHER PUBLICATIONS

International Preliminary Report on Patentability for International Application No. PCT/EP2020/074832, dated Mar. 17, 2022.
International Search Report and Written Opinion for International Application No. PCT/EP2020/074832, dated Nov. 6, 2020.

* cited by examiner

*Primary Examiner* — Metasebia T Retebo
(74) *Attorney, Agent, or Firm* — Wolf, Greenfield & Sacks, P.C.

(57) ABSTRACT

A circuit, intended to be associated in series with a load to be powered including a first field-effect transistor; at least one second field-effect transistor, associated in parallel with the first transistor; and at least one sensor of information representative of a current transmitted to said load, the gate of the second transistor being coupled to an output of the sensor.

14 Claims, 5 Drawing Sheets

TRANSISTOR ASSOCIATION

This application is a national stage filing under 35 U.S.C. § 371 of International Patent Application Serial No. PCT/EP2020/074832, filed Sep. 4, 2020, which claims priority to French patent application 19/09771, filed Sep. 5, 2019. The contents of these applications are incorporated herein by reference in their entireties.

TECHNICAL BACKGROUND

The present disclosure generally concerns electronic circuits and, more particularly, electronic circuits implementing field-effect transistors which are frequently switched between a conductive state and a non-conductive state.

PRIOR ART

Field-effect transistors are sometimes used for power electronics applications, that is, applications implementing high-intensity electric currents, typically higher than 10 A. These field-effect transistors then have significant dimensions, enabling them to withstand these high-intensity currents. Due to their significant dimensions, these transistors often have large gate surface areas, typically in the range from 5 to 20 mm$^2$, and thus high gate capacitances.

The gate capacitances are usually called parasitic, since they cause power losses once they have been charged. In the case, for example, of power conversion systems which operate at high frequencies, many switchings of the transistor, between the conductive state and the non-conductive state, occur during very short time periods. These repeated switchings generate significant power losses, due to many cycles of charge and discharge of the gate capacitors.

Such power conversion systems are for example embarked on electric vehicles powered by batteries. These vehicles have by nature a limited power source. It is thus generally desired to limit power losses, in other words to maximize the efficiency, of the different systems embarked on these vehicles. This particularly enables to optimize their autonomy.

SUMMARY

There is a need to decrease the power losses of power conversion systems comprising field-effect transistors.

An embodiment overcomes all or part of the disadvantages of known power conversion systems.

An embodiment provides a circuit, intended to be associated in series with a load to be powered, comprising:
  a first field-effect transistor;
  at least one second field-effect transistor, associated in parallel with the first transistor; and
  at last one sensor of information representative of a current transmitted to said load,
  the gate of the second transistor being coupled to an output of said sensor.

According to an embodiment, said circuit comprises a plurality of second transistors and a plurality of sensors, the gate of each second transistor being coupled to the output of an associated sensor.

According to an embodiment, said circuit comprises a plurality of second transistors, the gates of the second transistors being coupled to the output of a common sensor.

According to an embodiment, said circuit comprises a first number of second transistors and a second number of sensors, smaller than the first number, each sensor being associated with one or a plurality of second transistors.

According to an embodiment, the series association of the transistors and of the load is connected between a terminal of application of a potential powering the load and a terminal of application of a reference potential.

According to an embodiment, the parallel association of the transistors comprises between one and fifty second transistors, preferably between one and twenty second transistors, more preferably three or four second transistors.

According to an embodiment, each sensor comprises a third field-effect transistor, mounted in a current mirror on the first transistor.

According to an embodiment, the drain of the first transistor, the drain of the second transistor(s), and the drain of the third transistor are connected to the terminal of application of the potential powering the load.

According to an embodiment, the third transistor is associated in series with a first resistor, having a first terminal connected to the source of the third transistor and having a second terminal connected to the terminal of application of the reference potential.

According to an embodiment, each sensor is coupled to the gate of the second transistor(s) via a control circuit comprising:
  a fourth transistor associated in series with a second resistor, having a first terminal connected to the drain of the fourth transistor and having a second terminal connected to a terminal of application of a control potential; and
  a fifth transistor associated in series with a third resistor, having a first terminal connected to the drain of the fifth transistor and having a second terminal connected to the terminal of application of the control potential,
  the gate of the fourth transistor being connected to a node of interconnection of the third transistor and of the first resistor, and the gate of the fifth transistor being connected between the fourth transistor and the second resistor.

According to an embodiment, the gate of the second transistor is connected between the fifth transistor and the third resistor.

According to an embodiment, a conductive or non-conductive state of the second transistor depends on the voltage present at said node.

An embodiment provides a method of controlling a circuit, intended to be associated in series with a load to be powered, comprising:
  a first field-effect transistor; and
  at least one second field-effect transistor, associated in parallel with the first transistor,
  wherein the second transistor is controlled according to a current transmitted to the load.

According to an embodiment, the current is detected by at least one sensor.

An embodiment provides a method implemented by a circuit such as described.

An embodiment provides a system comprising:
  a circuit such as described;
  a load; and
  a power source.

An embodiment provides an electric vehicle comprising a system such as described.

BRIEF DESCRIPTION OF THE DRAWINGS

The foregoing features and advantages, as well as others, will be described in detail in the following description of specific embodiments given by way of illustration and not limitation with reference to the accompanying drawings, in which.

DESCRIPTION OF THE EMBODIMENTS

Like features have been designated by like references in the various figures. In particular, the structural and/or functional features that are common among the various embodiments may have the same references and may dispose identical structural, dimensional and material properties.

For the sake of clarity, only the steps and elements that are useful for an understanding of the embodiments described herein have been illustrated and described in detail.

Unless specified otherwise, when reference is made to two elements connected together, this signifies a direct connection without any intermediate elements other than conductors, and when reference is made to two elements coupled together, this signifies that these two elements can be connected or they can be coupled via one or more other elements.

In the following description, when reference is made to terms qualifying absolute positions, such as terms "front", "rear", "top", "bottom", "left", "right", etc., or relative positions, such as terms "above", "under", "upper", "lower", etc., or to terms qualifying directions, such as terms "horizontal", "vertical", etc., it is referred to the orientation of the drawings, it being understood that, in practice, the described devices may be oriented differently.

Unless specified otherwise, the expressions "around", "approximately", "substantially" and "in the order of" signify within 10%, and preferably within 5%.

In the following description, the expression "gate-source voltage" designates a voltage applied or present between the gate and the source of a field-effect transistor. In other words, the gate-source voltage corresponds to a difference between an electric potential applied to the gate terminal and an electric potential applied to the source terminal of this field-effect transistor.

Further, the expression "threshold voltage" designates a minimum value of the gate-source voltage from which a field-effect transistor switches between a non-conductive state and a conductive state. For an n-channel MOS transistor, the threshold voltage corresponds to a positive gate-source voltage value below which the transistor is in a non-conductive state and above which the transistor is in a conductive state. Conversely, for a p-channel MOS transistor, the threshold voltage corresponds to a negative gate-source voltage value below which the transistor is conductive and above which the transistor is non-conductive.

To be able to charge and discharge gate capacitors within a sufficiently short time to suit the targeted power conversion applications, it may be devised to use control circuits (drivers) capable of delivering currents reaching some ten amperes. In addition to the fact that such control circuits are generally expensive and bulky, they would also cause significant losses by Joule effect due to the presence of a gate resistor conventionally used to limit possible oscillations during switchings. For a gate resistance in the range from 5 to 20Ω, the power lost at each second, for a 500-kHz operating frequency, would then typically be in the order of from 0.25 to 1 J. These losses would adversely affect the efficiency of the power conversion system.

Figure 1:
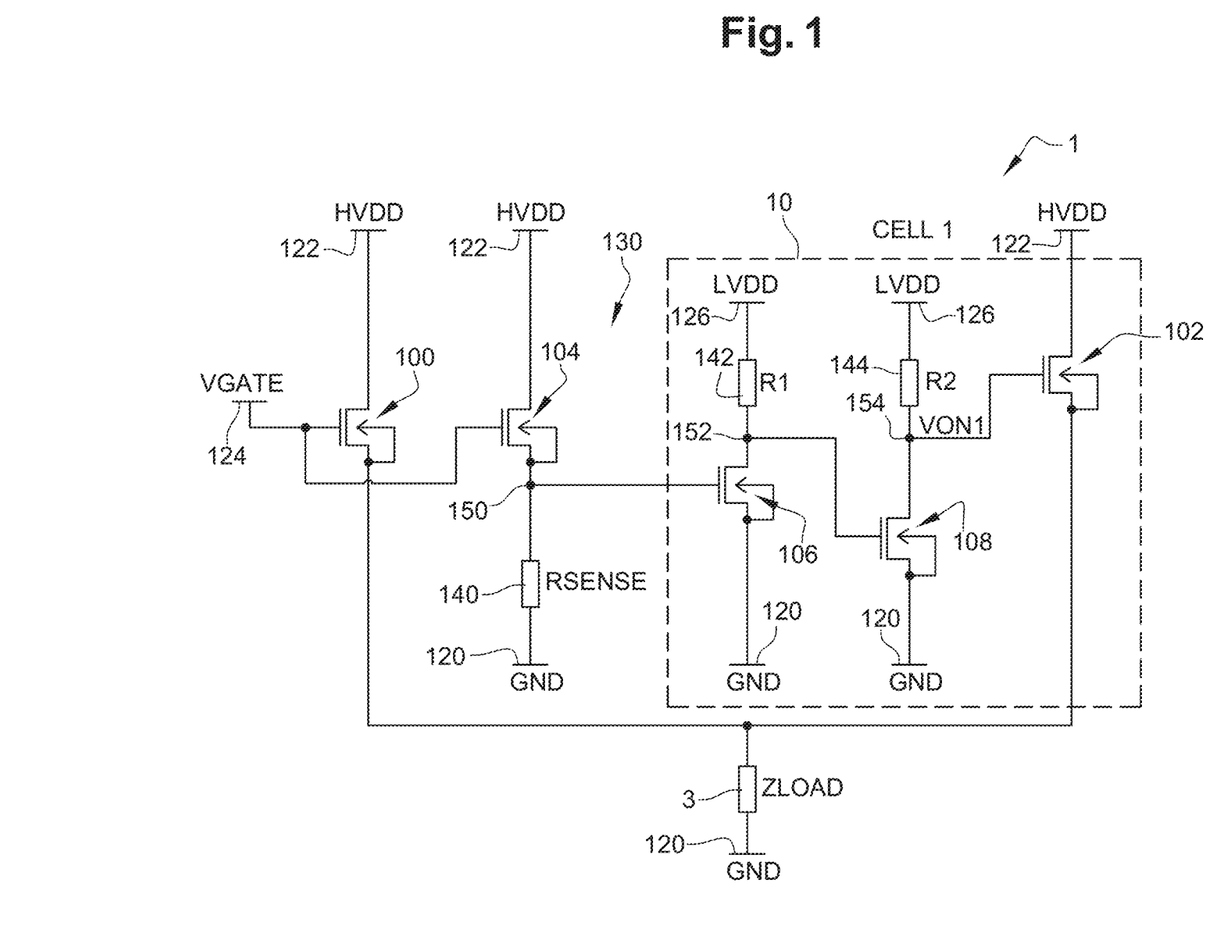
FIG. 1 schematically shows an embodiment of an electronic circuit intended to be series-connected to a load.

FIG. 1 schematically shows an embodiment of an electronic circuit 1 intended to be series-connected to a load 3 (ZLOAD).

According to this embodiment, circuit 1 comprises a first cell 10 (CELL 1) coupled in parallel to a first transistor 100. This first cell 10 is also called portion, branch, or part of circuit 1. The first cell 10 of circuit 1 comprises a second transistor 102 adapted to being switched according to the intensity of an electric current transmitted to load 3. Second transistor 102 is coupled in parallel to first transistor 100, while first transistor 100 and second transistor 102 are associated in series with load 3.

More precisely, in FIG. 1, the source of first transistor 100 and the source of second transistor 102 are coupled, preferably connected, to a terminal of load 3. Another terminal of load 3 is coupled, preferably connected, to a first terminal 120 of application of a reference potential, for example, the ground (GND). The drain of first transistor 100 and the drain of second transistor 102 are coupled, preferably connected, to a second terminal 122 of application of a potential (HVDD) powering load 3.

Circuit 1 further comprises a current sensor 130 adapted to detecting or evaluating information representative of the electric current transmitted to load 3. This current sensor 130 comprises a third transistor 104 associated in series with a first resistor 140 (RSENSE). A terminal of this first resistor 140 is coupled, preferably connected, to the source of third transistor 104. The other terminal of this first resistor 140 is coupled, preferably connected, to the first terminal 120 of application of reference potential GND. The drain of third transistor 104 is coupled, preferably connected, to the second terminal 122 of application of potential HVDD.

Third transistor 104 is mounted in a current mirror on first transistor 100. In FIG. 1, the gate of first transistor 100 and the gate of third transistor 104 are both coupled, preferably connected, to a same terminal 124 of application of a gate potential, noted VGATE. This thus enables to obtain, across first resistor 140, a voltage proportional to the electric current transmitted to load 3. In other words, third transistor 104 plays the role of a current sensor.

Inside of the first cell 10 of circuit 1, a fourth transistor 106 is associated in series with a second resistor 142 (R1). The source of this fourth transistor 106 is coupled, preferably connected, to the first terminal 120 of application of reference potential GND. The drain of fourth transistor 106 is coupled, preferably connected, to a terminal of second resistor 142. The other terminal of this second resistor 142 is coupled, preferably connected, to a fourth terminal 126 of application of a control potential (LVDD). The gate of fourth transistor 106 is coupled, preferably connected, to a first interconnection node 150 located between the source of third transistor 104 and first resistor 140. First interconnection node 150 here forms an output of sensor 130.

Control potential LVDD is preferably smaller than power supply potential HVDD. Control potential LVDD is, for example, in the order of from 5 to 10 V while power supply potential HVDD is for example in the order of 400 V.

Similarly, still inside of the first cell 10 of circuit 1, a fifth transistor 108 is associated in series with a third resistor 144 (R2). The source of this fifth transistor 108 is coupled, preferably connected, to the first terminal 120 of application of reference potential GND. The drain of fifth transistor 108 is coupled, preferably connected, to a terminal of third resistor 144. The other terminal of this third resistor 144 is coupled, preferably connected, to the fourth terminal 126 of application of potential LVDD. The gate of fifth transistor 108 is located, preferably connected, to a second node 152 located between the drain of fourth transistor 106 and second resistor 142.

The gate of second transistor 102 is coupled, preferably connected, to a third node 154 located between the drain of fifth transistor 108 and third resistor 144.

First transistor 100, second transistor 102, third transistor 104, fourth transistor 106, and fifth transistor 108 are, preferably, MOS transistors. These transistors 100, 102, 104, 106, and 108 may be, for example, insulated gate field-effect transistors (Metal Oxide Semiconductor Field Effect Transistor—MOSFET or Metal Insulator Semiconductor Field Effect Transistor—MISFET), junction field-effect transistors (JFET), laterally diffused metal oxide semiconductor transistors (LDMOS), high electron mobility transistors (HEMT), etc.

In the following description, it is considered that first transistor 100, second transistor 102, third transistor 104, fourth transistor 106, and fifth transistor 108 are n-channel MOS transistors.

During a first operating phase of circuit 1, it is assumed that load 3 draws a current having an intensity such that the voltage across the first resistor 140 of current sensor 130, that is, the electric potential at first node 150, is not sufficiently high to switch first transistor 106 from a non-conductive state to a conductive state. In other words, it is assumed that the gate-source voltage of the fourth transistor, which is approximately equal to the voltage between first node 150 and first terminal 120, is smaller than the threshold voltage of this fourth transistor 106. Fourth transistor 106 thus is in the non-conductive state. The potential at second node 152 is thus substantially equal to the potential LVDD applied to fourth terminal 126.

Potential LVDD is in practice selected so that the gate-source voltage of fifth transistor 108 which, in this phase, is approximately equal to the voltage between second node 152 and first terminal 120, is greater than the threshold voltage of this fifth transistor 108. Fifth transistor 108 thus is in the conductive state. The potential present at third node 154, noted VON1, is accordingly substantially equal to the reference potential GND applied to first terminal 120, to within voltage drops linked to the inner resistance between the drain and the source of fifth transistor 108 in the conductive state. In circuit 1, this amounts to setting third node 154 to ground. The gate-source voltage of second transistor 102 is then smaller than the threshold voltage of this second transistor 102. Second transistor 102 is thus non-conductive during this first operating phase.

During a second operating phase of circuit 1, it is assumed that load 3 draws a current having an intensity, greater than that of the first operating phase, such that the voltage across the first resistor 140 of current sensor 130 is sufficiently high to switch fourth transistor 106 from a non-conductive state to a conductive state. In other words, it is assumed that the gate-source voltage of the fourth transistor is, in this second phase, greater than the threshold voltage of this fourth transistor 106. Fourth transistor 106 thus is in the conductive state. The potential at second node 152 is thus substantially equal to the reference potential GND applied to the first terminal 120, to within the voltage drops linked to the inner resistance between the drain and the source of fourth transistor 106 in the conductive state. In circuit 1, this amounts to setting second node 152 to ground.

The gate-source voltage of fifth transistor 108 is in this case smaller than the threshold voltage of fifth transistor 108. Fifth transistor 108 thus is in the non-conductive state. The potential VON1 present at third node 154 is accordingly substantially equal to the control potential LVDD applied to fourth terminal 126. Control voltage LVDD is in practice selected so that the gate-source voltage of second transistor 102 is then greater than the threshold voltage of this second transistor 102. Second transistor 102 is thus conductive during this second operating phase.

By selecting the threshold voltage of third transistor 104, or the value of resistance 140, according to a given application, a current threshold transmitted to load 3 above which second transistor 102 is switched to the conductive state and below which this second transistor 102 is in the non-conductive state can thus be adjusted. According to a preferred embodiment, third transistor 104 is selected so that its threshold voltage enables to switch second transistor 102 to the conductive state when the current transmitted to load 3 is equal to a fraction of the maximum current that may be transmitted to this load 3.

As compared with a power conversion circuit comprising a single power transistor, the presence, in circuit 1, of first transistor 100 and of second transistor 102 advantageously enables to make the number of transistors used a function of the current demand of load 3. For example, only first transistor 100 is used during phases where the current demand of load 3 is lower, as compared with other phases where the current demand is greater and where both transistors 100 and 102 are used. Power losses are thus significantly decreased, by limiting the gate capacitors charged and discharged during phases when the current demand is lower, while remaining fully compatible with phases when the current demand is greater.

In practice, first transistor 100 and second transistor 102 are transistors which are sized to jointly admit the maximum current that can be transmitted to the load in the considered application. As an example, in the case of an application where the load is likely to draw a current having a 80-A maximum intensity, first transistor 100 and second transistor 102 are, for example, transistors comprising 200 1-mm fingers and characterized by a 40-A current caliber. Third transistor 104 is for example a transistor characterized by a current caliber twenty times smaller than that of first transistor 100 and of second transistor 102. Fourth transistor 106 is, for example, a transistor comprising 20 fingers. Fifth transistor 108 is for example a transistor comprising 10 fingers.

First resistor 140 is sized so that the voltage present thereacross when the current transmitted to load 3 is maximum does not exceed the maximum gate-source voltage admissible by third transistor 104, this maximum gate-source voltage admissible by third transistor 104 here being in the order of 5 V. Still as an example:
- the electric resistance of first resistor 140 is approximately 100Ω;
- the electric resistance of second resistor 142 is approximately 10 kΩ; and
- the electric resistance of third resistor 144 is approximately 10 kΩ.

An advantage of circuit 1 lies in the fact that it enables to drive a first transistor and a second transistor 102 having different threshold voltages. Assuming that first transistor 100 has a 1-V threshold voltage and that second transistor 102 has a 2-V threshold voltage, the control voltage LVDD, applied to fourth terminal, can indeed be adapted to make the operation of circuit 1 compatible with the threshold voltage of second transistor 102. This adaptation of control voltage LVDD however does not impact the gate voltage VGATE, relative to the source of first transistor 100, applied to third terminal 124, which may be made compatible with the threshold voltage of first transistor 100 in totally independent fashion.

Another advantage of circuit 1 lies in the fact that it further enables to use a first transistor 100 and a second transistor 102 of different sizes to divide or share the current transmitted to load 3. As an example, an application where load 3 draws, in transient state, a current of approximately 40 A and, in steady state, a current of approximately 10 A only, is considered. Third transistor 104 can then be sized so that its threshold voltage corresponds to a current transmitted to load 3 slightly greater than the current drawn in steady state.

One may, still according to this example, select the third transistor 104 so that its threshold voltage corresponds to a current transmitted to load 3 in the order of 12 A. In circuit 1, only first transistor 100 is thus switched in steady state, while second transistor 102 is itself only switched during the transient state. This enables to advantageously use a first transistor 100 of smaller caliber than that of second transistor 102 (approximately four times smaller, in this example). The gate capacitance of this first transistor 100 is thus smaller than that of second transistor 102, which enables to further decrease the power losses of circuit 1 and the durations necessary for the switching. This thus enables to obtain a circuit 1 having, as compared with usual power conversion circuits, a greater efficiency and better dynamics.

Still another advantage of circuit 1 lies in the fact that it comprises no microcontroller to control the switching of second transistor 102. This thus enables to have a circuit 1 with a longer response time than usual systems comprising microcontrollers and a simpler architecture.

Figure 2:
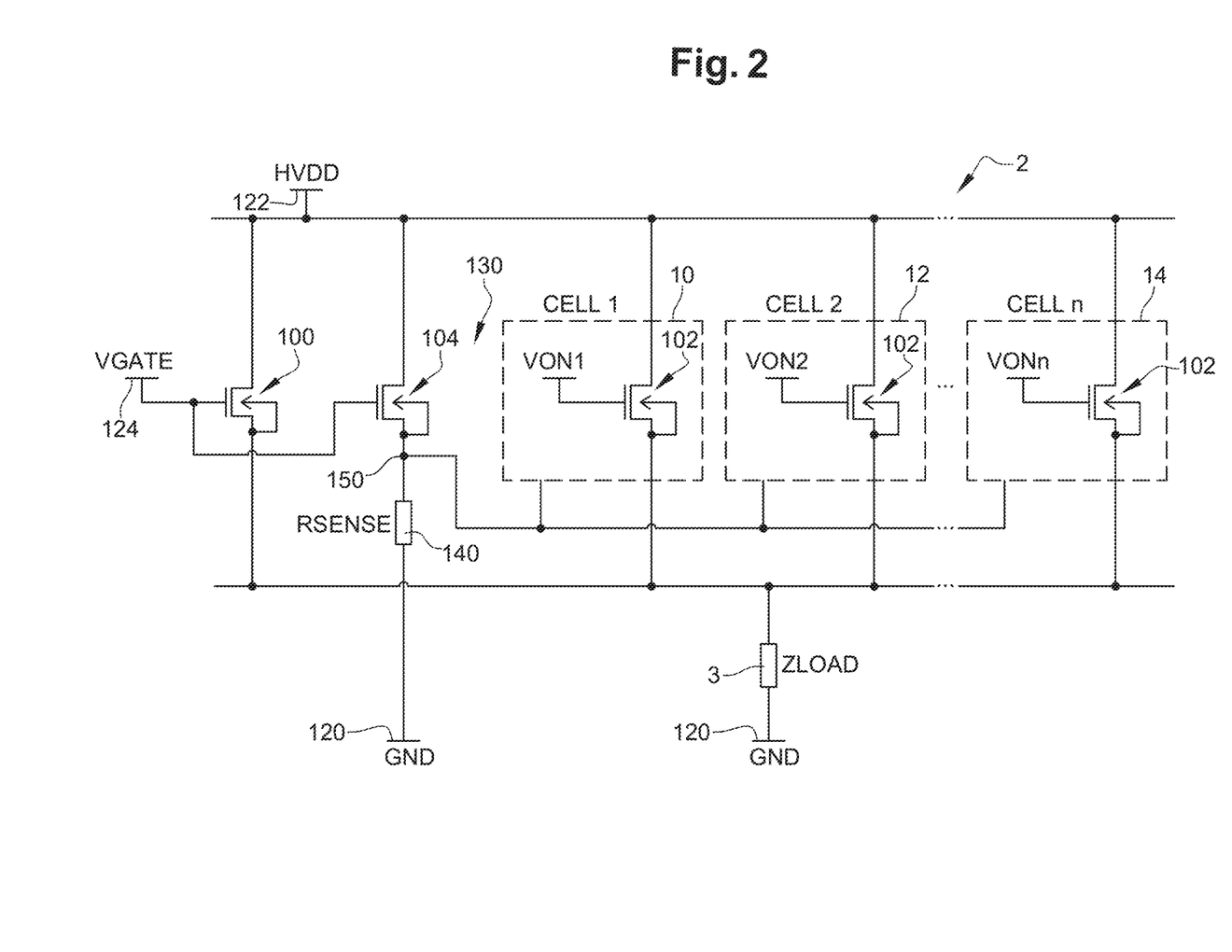
FIG. 2 schematically shows another embodiment of an electronic circuit intended to be series-connected to a load.

FIG. 2 schematically shows another embodiment of an electronic circuit 2 intended to be series-connected to load 3. The circuit 2 of FIG. 2 comprises elements common with the circuit 1 of FIG. 1. These common elements will not be detailed again hereafter. The circuit 2 of FIG. 2 differs from the circuit 1 of FIG. 1 mainly in that it comprises a plurality of cells similar to the first cell CELL 1, for example a total of n cells CELL i (i ranging from 1 to n).

In FIG. 2, three cells 10 (CELL 1), 12 (CELL 2), and 14 (CELL n) have been shown. Circuit 2 may however comprise any number of cells. In the example of FIG. 2, all cells 10, 12, and 14 each comprise a second transistor 102. The number of cells of circuit 2 is thus equivalent to the number of second transistors 102 of this circuit 2. Circuit 2 comprises, in practice, between one and fifty second transistors, preferably between one and twenty second transistors, more preferably three or four second transistors.

In circuit 2, the gate of the second transistor 102 of second cell 12 is submitted to a potential noted VON2. Similarly, the gate of the second transistor 102 of third cell 14 is submitted to a potential noted VONn. These potentials VON2 and VONn determine the conductive or non-conductive state of the second transistors 102 of cells 12 and 14, respectively. Potentials VON2 and VONn are preferably created or applied in the same way as potential VON1, as discussed in relation with FIG. 1.

In the embodiment of FIG. 2, the gates of the second transistors 102 of cells 10, 12, and 14 are coupled to the output of a common sensor 130. In other words, circuit 2 comprises a single sensor 130.

The second cell 12 and the third cell 14 of circuit 2 each have a fourth transistor 106 (not shown in FIG. 2) having its gate coupled, preferably connected, to the node 150 of the common sensor 130. By adjusting the threshold voltage of each fourth transistor 106 and/or by adjusting the values of resistors R1 and R2 (not shown in FIG. 2) of each cell 10, 12, and 14, it may advantageously be ascertained to distribute the current transmitted to load 3 over all or part of the first and second transistors 100, 102 of circuit 2.

The number of second transistors 102 of circuit 2, and the threshold voltage of the fourth transistors 106 with which they are associated and/or the value of resistors R1 and R2, are then selected according to a discretization or distribution of the targeted current. In particular, the larger the number of second transistors 102, the more it is possible to ascertain that the gate capacitances which are alternately charged and discharged are constituent with variations of the current transmitted to load 3.

Another advantage of circuit 2 lies in the fact that this distribution of the current transmitted to load 3 in a plurality of power transistors (first transistor 100 and second transistors 102, in the case of circuit 2) allows a decrease in the surface area occupied by each transistor. In an embodiment where circuit 2 is formed in a silicon wafer, this surface area decrease enables to optimize the power efficiency.

Still another advantage of circuit 2 lies in the fact that circuit 2 uses a single current sensor 130 to drive the activation and the deactivation of a plurality of cells independently. This particularly enables to limit the space occupied by circuit 2.

Figure 3:
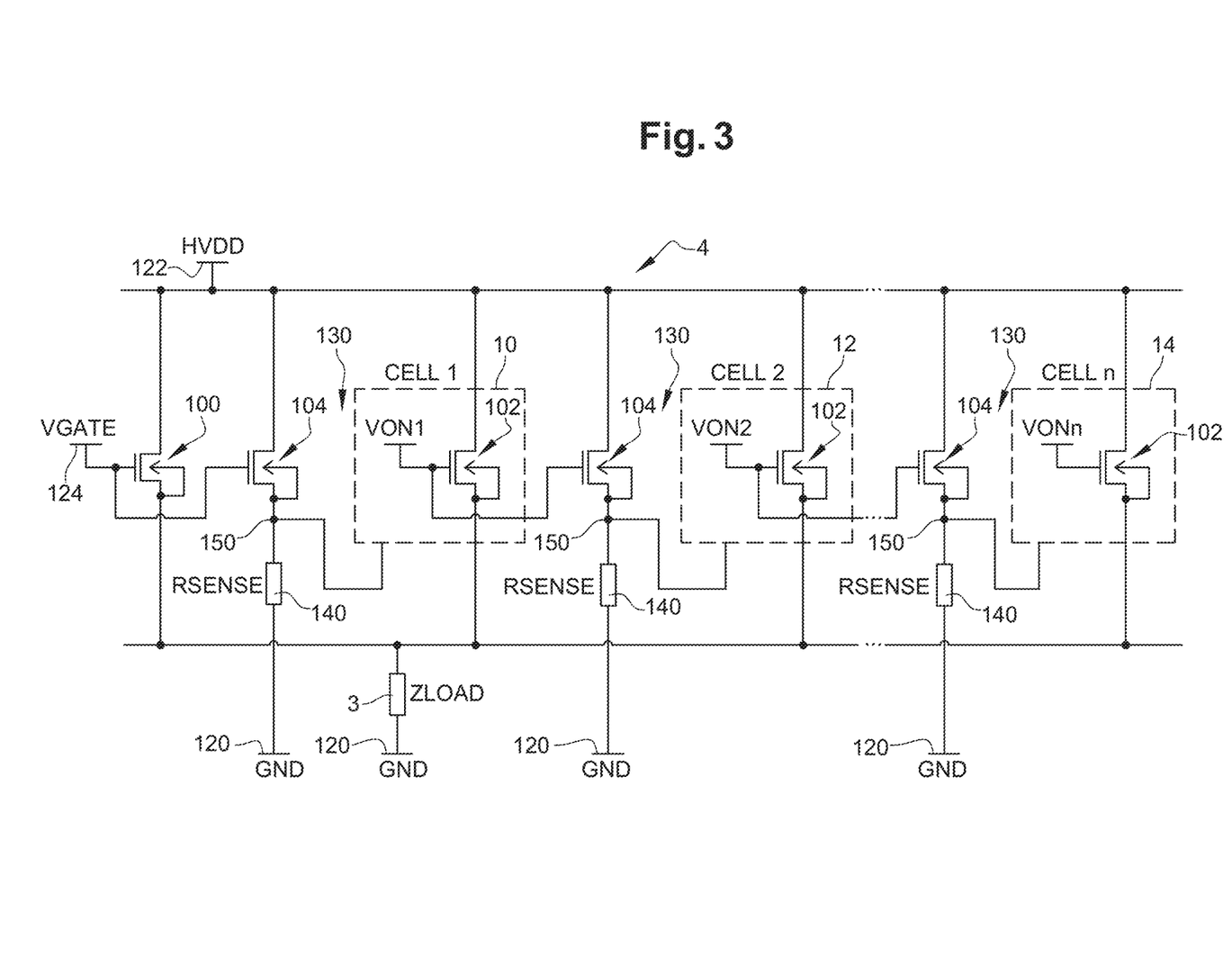
FIG. 3 schematically shows still another embodiment of an electronic circuit intended to be series-connected to a load.

FIG. 3 schematically shows another embodiment of an electronic circuit 4 intended to be series-connected to load 3. The circuit 4 of FIG. 3 comprises elements common with the circuit 2 of FIG. 2. These common elements will not be detailed again hereafter. The circuit 4 of FIG. 3 differs from the circuit 2 of FIG. 2 mainly in that each cell 10, 12, and 14 is associated with a current sensor 130 which is specific thereto.

In FIG. 3, three cells 10, 12, and 14 and three associated current sensors 130 have been shown. Circuit 4 may however comprise any number of cells, equivalent to the number of second transistors 102. Circuit 4 comprises, in practice, between one and fifty second transistors, preferably between one and twenty second transistors, more preferably three or four second transistors.

In the embodiment of FIG. 3, the gates of the second transistors 102 of cells 10, 12, and 14 are each coupled to the output of an associated sensor 130. In the case of circuit 4, each transistor 102 is thus coupled to a sensor 130 which is specific thereto, conversely to the case of circuit 2 where all transistors 102 are coupled to a common sensor 130.

The second cell 12 and the third cell 14 of circuit 4 each comprise a third transistor 104 (not shown in FIG. 3) having its gate coupled, preferably connected, to the first node 150 of the associated sensor 130. By adjusting the value of the resistance RSENSE of sensor 130 associated with each cell 10, 12, and 14, it may advantageously be ascertained to distribute the current transmitted to load 3 between all or part of the first and second transistors 100, 102 of circuit 4.

The number of second transistors 102 of circuit 4 and the value of resistances RSENSE are then selected according to a targeted discretization or distribution of the current to obtain advantages similar to those discussed in relation with FIG. 2.

As a variant, the embodiments described in relation with FIGS. 2 and 3 may be combined. A circuit comprising a plurality of sensors 130 may in particular be provided, where each sensor 130 is associated with one or a plurality of second transistors 102. In such a circuit comprising a first number of second transistors 102 and a second number of sensors 130, the second number is then smaller than the first number.

Figure 4:
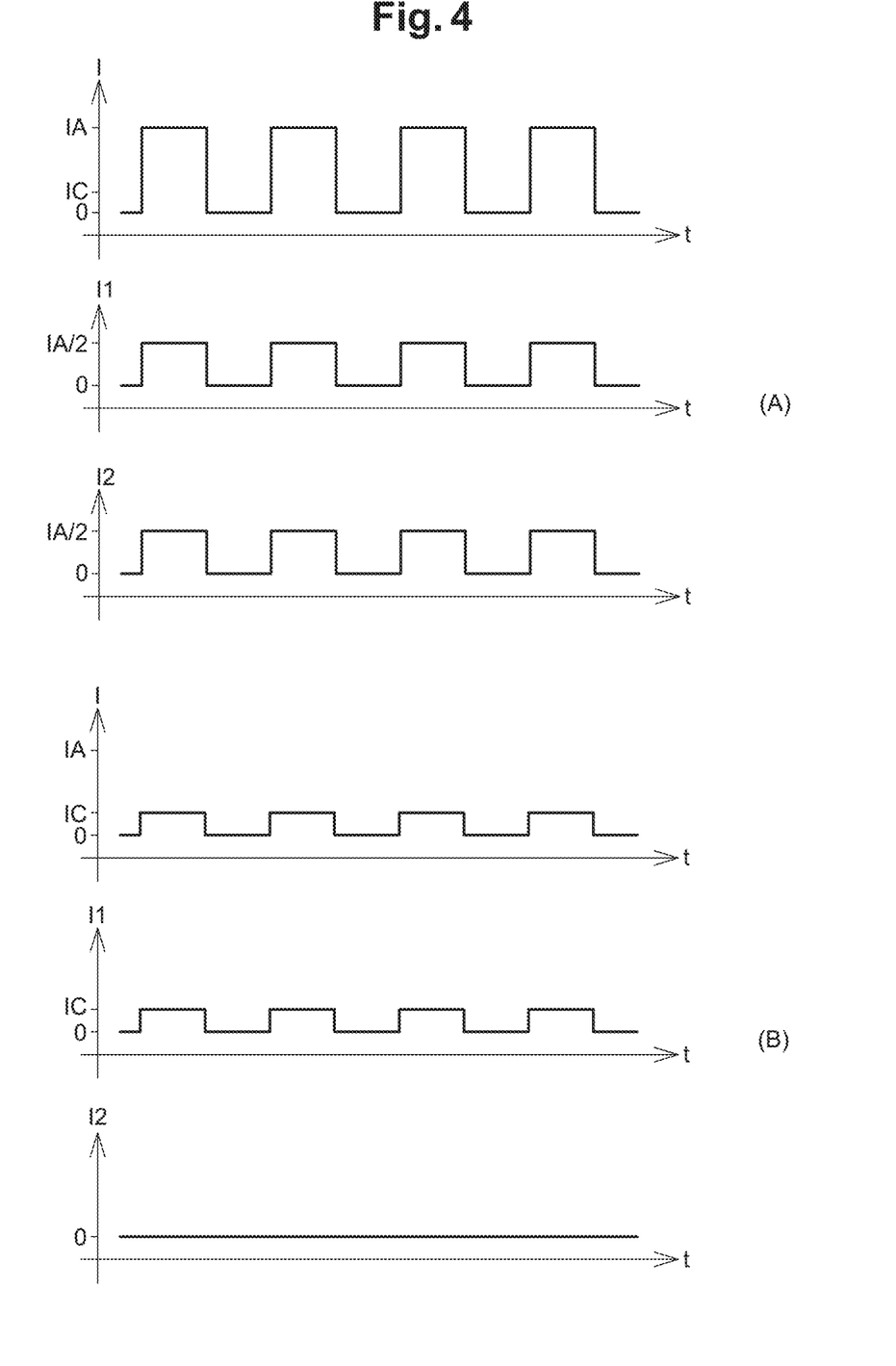
FIG. 4 shows, in views (A) and (B), timing diagrams illustrating the operation of the circuit described in relation with FIG. 1.

FIG. 4 shows, in views (A) and (B), timing diagrams illustrating the operation of the circuit 1 described in relation with FIG. 1.

As an example, it is considered in FIG. 4 that circuit 1 is used in an electric vehicle to convert a DC current originating from a battery into an AC current powering a motor adapted to propelling this vehicle (DC/AC-type conversion). The motor then plays the role of load 3, the voltage HVDD powering the motor being delivered by the battery. Two operating phases are only considered, still in this example:
 a first operating phase, illustrated in view (A), during which the vehicle accelerates; and
 a second operating phase, illustrated in view (B), during which the vehicle runs at a stabilized pace, that is, at constant speed.

In FIG. 4, note IA the maximum intensity of the AC current transmitted to the motor during the first operating phase and IC the maximum intensity of the AC current transmitted to the motor during the second operating phase. This maximum intensity IC drawn when the vehicle runs at constant speed is smaller than the maximum intensity IA drawn when the vehicle accelerates. As an example, it is arbitrarily considered that intensity IA is four times greater than intensity IC.

For simplification, it is assumed that first transistor 100 is identical to second transistor 102. It is further assumed that third transistor 104 is switched from the non-conductive state to the conductive state from a current greater than IC and smaller than IA.

FIG. 4 considers a variation according to time (t):
 of an AC current, noted I, transmitted to load 3;
 of an AC current, noted I1, running through first transistor 100; and
 of an AC current, noted I2, running through second transistor 102.

The timing diagram of view (A) illustrates the first operating phase, when current I transmitted to load 3 periodically oscillates between 0 and IA. The third transistor 104 of circuit 1 is conductive each time current I is equal to IA and non-conductive each time current I is equal to 0. Current I is then distributed between first transistor 100 and second transistor 102. The current I1 running through first transistor 100 is thus approximately equal to half of current I. In view (A), this current I1 thus oscillates in phase with current I between values 0 and IA/2.

Similarly, the current I2 flowing through second transistor 102 is approximately equal to half of current I. In view (A), this current I2 thus oscillates in phase with current I between values 0 and IA/2. In other words, the current I transmitted to load 3 during the first operating phase is substantially equitably distributed between first transistor 100 and second transistor 102.

The timing diagram of view (B) illustrates the second operating phase, when the current I transmitted to load 3 periodically oscillates between 0 and IC. The third transistor 104 of circuit 1 is permanently non-conductive. The current I1 flowing through first transistor 100 is then substantially equal to the current I transmitted to load 3. In view (B), this current I1 thus oscillates in phase with current I between values 0 and IC.

However, the current I2 running through second transistor 102 is, in this operating phase, substantially zero. In view (B), this current I2 remains approximately equal to 0, to within current leakages between the source and the drain of second transistor 102. In other words, the current I transmitted to load 3 during the second operating phase is only assigned to first transistor 100.

The operation of circuit 1 illustrated hereabove enables to only use first transistor 100 during the second phase, during which the vehicle runs at constant speed. The gate capacitance implemented during switchings during this second operating phase is thus decreased, which accordingly enables to improve the power efficiency of circuit 1 and to perform switchings at a higher frequency.

Figure 5:
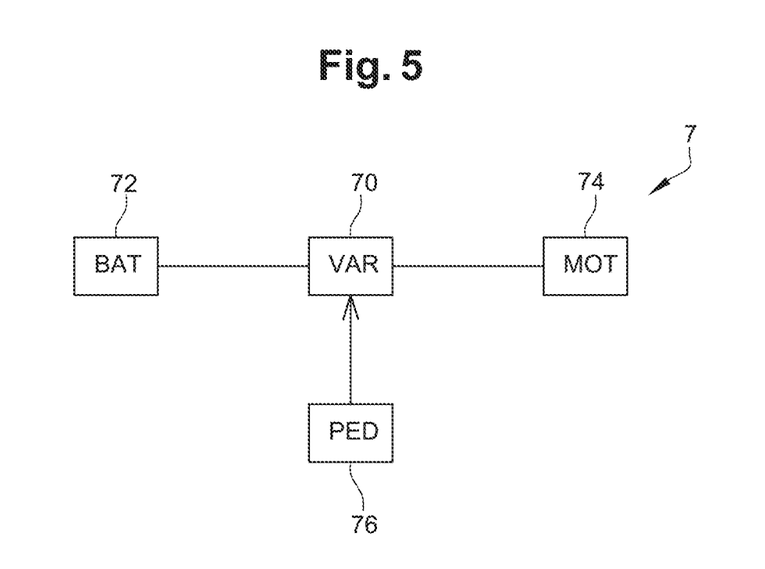
FIG. 5 very schematically shows in the form of blocks an embodiment of a power management system.

FIG. 5 very schematically shows in the form of blocks an embodiment of a power management system 7.

In FIG. 5, power management system 7 comprises a regulator 70 (VAR) enabling to regulate an electric current supplied by a power source or battery 72 (BAT) to an electric motor 74 (MOT). Regulator 70 is driven by an instruction originating from a pedal 76 (PED). It is for example assumed that motor 74 is rotated at a speed controlled according to the instruction originating from pedal 76. According to this embodiment, regulator 70 comprises a circuit similar to the circuit 1 of FIG. 1, to the circuit 2 of FIG. 2, or to the circuit 4 of FIG. 3.

According to the instruction transmitted to regulator 70 via pedal 76, a variable current is transmitted to motor 74. Considering that a modification of the position of the pedal leads to a situation where the motor accelerates and a holding of the pedal in a same position leads to another situation where the motor rotates a constant speed, this comes down to an operating mode comprising two phases similar to those discussed in relation with FIG. 4.

Figure 6:
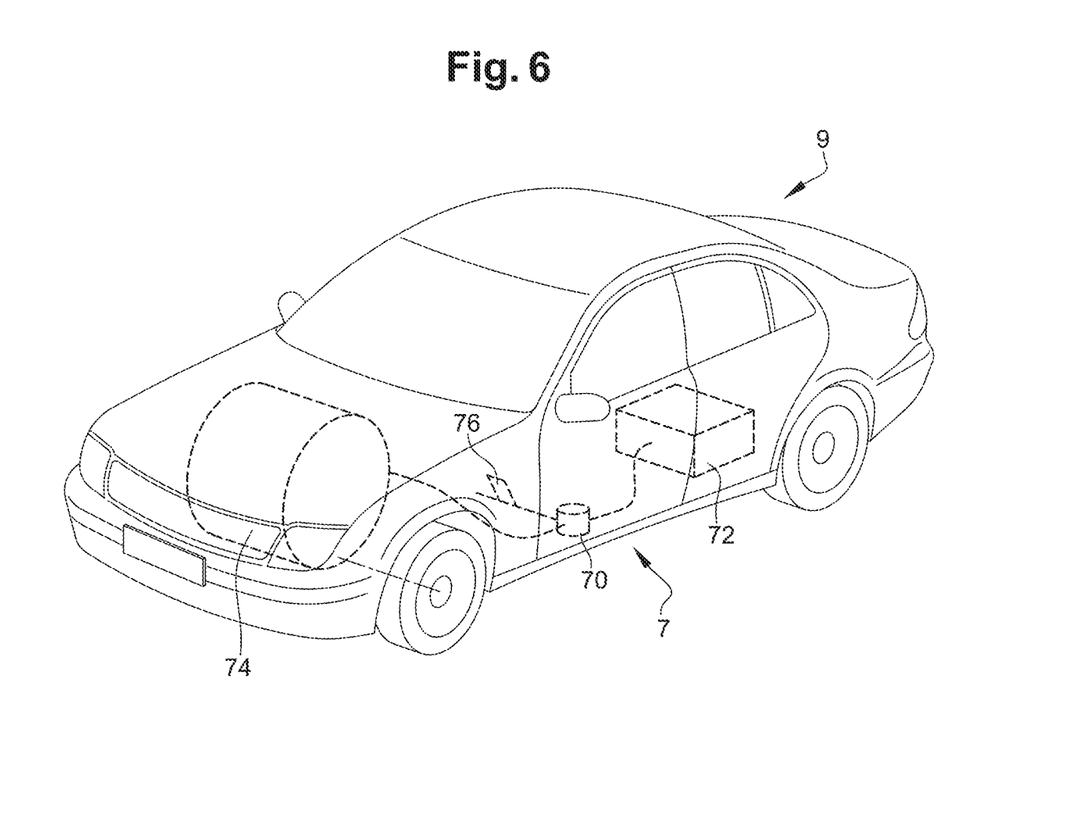
FIG. 6 illustrates an example of integration, in a vehicle, of the system such as described in relation with FIG. 5.

FIG. 6 illustrates an example of integration, in a vehicle 9, of the system 7 such as described in relation with FIG. 5.

In FIG. 6, system 7 for example enables to control the displacement speed of vehicle 9 according to the instruction transmitted via pedal 76, actuated by a conductor (not shown) of this vehicle 9. The use, in regulator 70, of a circuit similar to the previously-described circuits 1 and 2 enables to optimize the power efficiency of this regulator 70, and thus to decrease the discharge of the battery 72 embarked in vehicle 9. The autonomy of vehicle 9 is thus increased.

Various embodiments and variants have been described. It will be understood by those skilled in the art that certain characteristics of these various embodiments and variants may be combined, and other variants will occur to those skilled in the art. In particular, what is more particularly discussed in relation with an example of application to a motor vehicle power management circuit more generally applies to any system or method for managing the power supplied by a source and consumed by a load. Further, the transposition of the described embodiments to power management circuits comprising other types of field-effect transistors, particularly p-channel MOS transistors, is within the abilities of those skilled in the art based on the above indications.

Finally, the practical implementation of the described embodiments and variations is within the abilities of those skilled in the art based on the functional indications given hereabove. In particular, the sizing and the number of cells or of second transistors 102 may be adjusted according to the application based on the above indications.

The invention claimed is:

1. Circuit, intended to be associated in series with a load to be powered, comprising:
  a first field-effect transistor having a drain coupled, preferably connected, to a terminal of application of a potential powering the load and a gate coupled, preferably connected, to a terminal of application of a gate potential;
  at least one second field-effect transistor, in parallel on the first transistor; and
  at least one sensor of information representative of a current transmitted to said load, each sensor comprising a third field-effect transistor having a drain coupled, preferably connected, to the terminal of application of the potential powering the load and a gate coupled, preferably connected, to the terminal of application of the gate potential, the gate of the second transistor being connected to an output of said sensor,
  wherein each sensor is coupled to the gate of the second transistor(s) via a control circuit comprising:
  a fourth transistor associated in series with a second resistor, having a first terminal connected to the drain of the fourth transistor and having a second terminal connected to a terminal of application of a control potential; and
  a fifth transistor associated in series with a third resistor, having a first terminal connected to the drain of the fifth transistor, and having a second terminal connected to the terminal of application of the control potential,
  the gate of the fourth transistor being connected to a node of interconnection of the third transistor and of the first resistor, and the gate of the fifth transistor being connected between the fourth transistor and the second resistor.

2. The circuit according to claim 1 comprising a plurality of second transistors and a plurality of sensors, the gate of each second transistor being coupled to the output of an associated sensor.

3. The circuit according to claim 1 comprising a plurality of second transistors, the gates of the second transistors being coupled to the output of a common sensor.

4. The circuit according to claim 1 comprising a first number of second transistors and a second number of sensors, smaller than the first number, each sensor being associated with one or a plurality of second transistors.

5. The circuit according to claim 1, wherein the parallel association of the transistors comprises between one and fifty second transistors, preferably between one and twenty second transistors, more preferably three or four second transistors.

6. The circuit according to claim 1, wherein the series association of the transistors and of the load is connected between a terminal of application of the potential powering the load and a terminal of application of a reference potential.

7. The circuit according to claim 6, wherein the drain of the first transistor, the drain of the second transistor(s), and the drain of the third transistor are connected to the terminal of application of the potential powering the load.

8. The circuit according to claim 6, wherein the third transistor is associated in series with a first resistor having a first terminal connected to a source of the third transistor and having a second terminal connected to the terminal of application of the reference potential.

9. The circuit according to claim 1, wherein the gate of the second transistor is connected between the fifth transistor and the third resistor.

10. The circuit according to claim 1, wherein a conductive or non-conductive state of the second transistor depends on the voltage present at said node.

11. Method of controlling a circuit, intended to be associated in series with a load to be powered, comprising:
  a first field-effect transistor having a drain coupled, preferably connected, to a terminal of application of a potential powering the load and a gate coupled, preferably connected, to a terminal of application of a gate potential; and
  at least one second field-effect transistors, associated in parallel with the first transistor,
  at least one sensor of information representative of a current transmitted to said load, each sensor comprising a third field-effect transistor having a drain coupled, preferably connected, to the terminal of application of the potential powering the load and a gate coupled, preferably connected, to the terminal of application of the gate potential,
  the gate of the second transistor being connected to an output of said sensor,
  wherein each sensor is coupled to the gate of the second transistor(s) via a control circuit comprising:
  a fourth transistor associated in series with a second resistor, having a first terminal connected to the drain of the fourth transistor and having a second terminal connected to a terminal of application of a control potential;
  a fifth transistor associated in series with a third resistor, having a first terminal connected to the drain of the fifth transistor, and having a second terminal connected to the terminal of application of the control potential, and
  the gate of the fourth transistor being connected to a node of interconnection of the third transistor and of the first resistor, and the gate of the fifth transistor being connected between the fourth transistor and the second resistor;
  wherein the second transistor is controlled according to a current transmitted to the load, the current being evaluated by at least one sensor comprising a third field-effect transistor mounted in a current mirror on the first transistor.

12. The method according to claim 11, wherein the current is detected by at least one sensor.

13. System comprising:
  the circuit according to claim 1;
  the load; and
  a power source.

14. Electric vehicle comprising a system according to claim 13.

* * * * *